United States Patent [19]
MacLellan et al.

[11] Patent Number: 5,959,932
[45] Date of Patent: Sep. 28, 1999

[54] METHOD AND APPARATUS FOR DETECTING ERRORS IN THE WRITING OF DATA TO A MEMORY

[75] Inventors: Christopher S. MacLellan, Norwood; Michael Bermingham, Framingham; John K. Walton, Mendon, all of Mass.

[73] Assignee: EMC Corporation, Hopkinton, Mass.

[21] Appl. No.: 09/135,290

[22] Filed: Aug. 17, 1998

[51] Int. Cl.[6] .................................................. G11C 8/00
[52] U.S. Cl. .............................. 365/230.05; 365/189.01; 365/221; 365/189.05
[58] Field of Search ........................ 365/230.05, 189.07, 365/221, 189.01, 189.05; 386/68

[56] References Cited

U.S. PATENT DOCUMENTS

| | | | |
|---|---|---|---|
| 5,088,061 | 2/1992 | Golnabi et al. | 365/189.01 |
| 5,568,443 | 10/1996 | Dixon et al. | 365/230.06 |
| 5,751,887 | 5/1998 | Nitta et al. | 386/68 |
| 5,771,331 | 6/1998 | Aoki et al. | 386/68 |

*Primary Examiner*—David Nelms
*Assistant Examiner*—David Lam
*Attorney, Agent, or Firm*—Wolf, Greenfield & Sacks, P.C.

[57] ABSTRACT

A buffer memory includes at least one memory including a plurality of memory locations, and at least one write-control circuit. When data is written to one of the plurality of memory locations, the at least one write-control circuit causes at least one bit of validation information to be written to the at least one memory to indicate that the data written to the one of the plurality of memory locations is valid. In response to data being read from the one of the plurality of memory locations, the at least one write-control circuit causes the at least one bit of validation information to be overwritten to indicate that the data stored in the one of the plurality of memory locations is invalid. In another embodiment, a method for operating a buffer memory including a plurality of memory locations includes steps of: (a) when data is written to one of the plurality of memory locations, storing at least one bit of validation information in the buffer memory indicating that the data written to the one of the plurality of memory locations is valid; and (b) in response to the data being read from the one of the plurality of memory locations, overwriting the at least one bit of validation information to indicate that the data stored in the one of the plurality of memory locations is invalid.

66 Claims, 11 Drawing Sheets

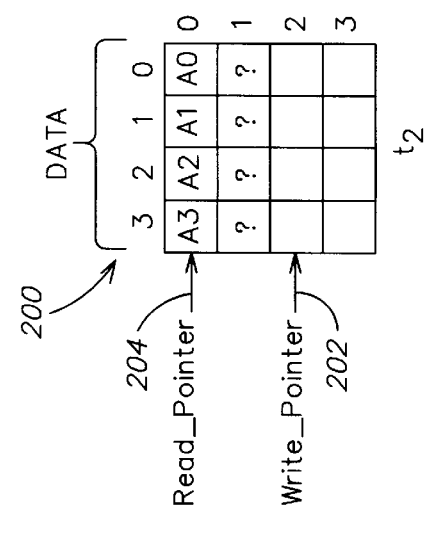
FIG. 4A (PRIOR ART)
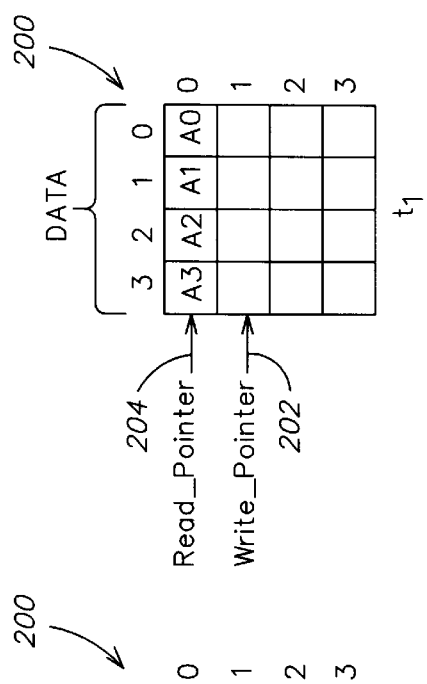
FIG. 4B (PRIOR ART)
FIG. 4C (PRIOR ART)
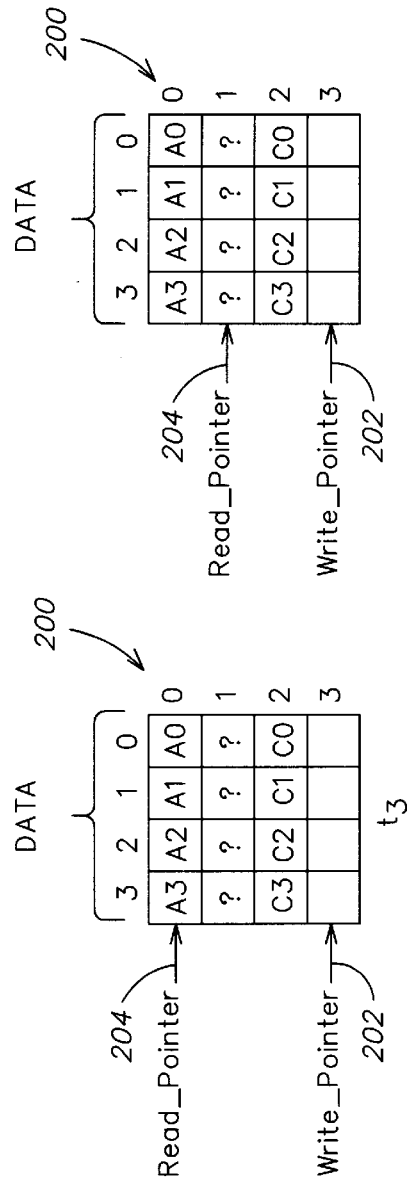
FIG. 4D (PRIOR ART)
FIG. 4E (PRIOR ART)

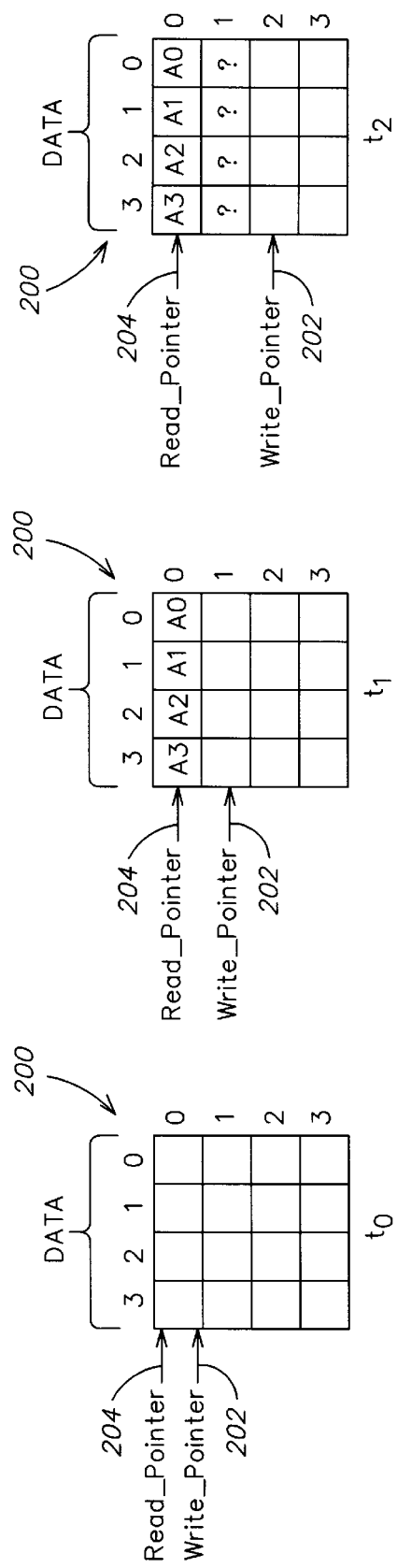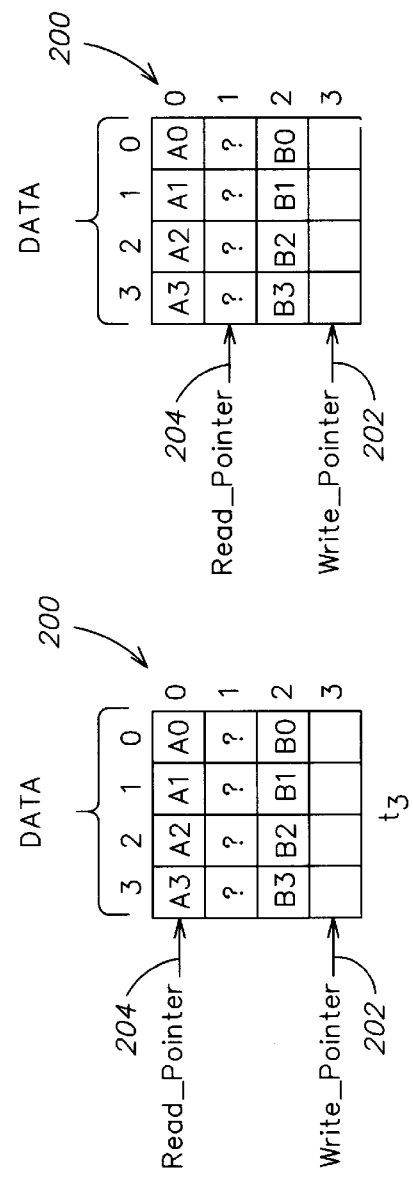

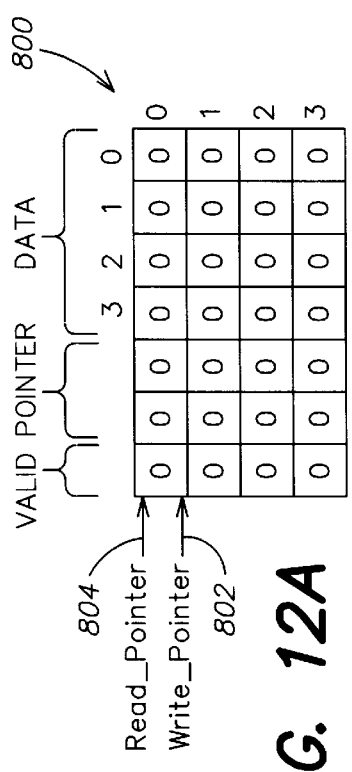
FIG. 12A
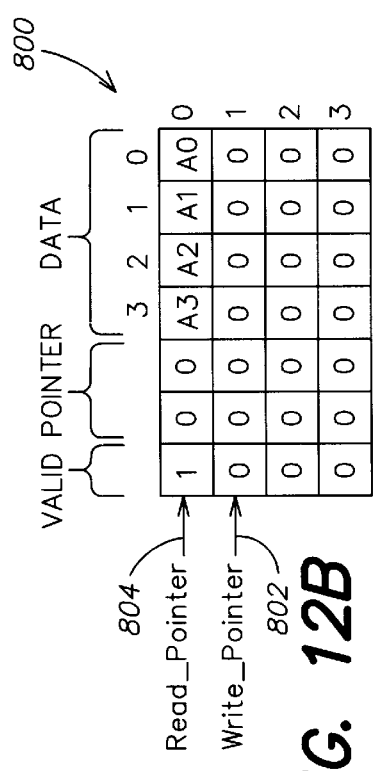
FIG. 12B
FIG. 12C
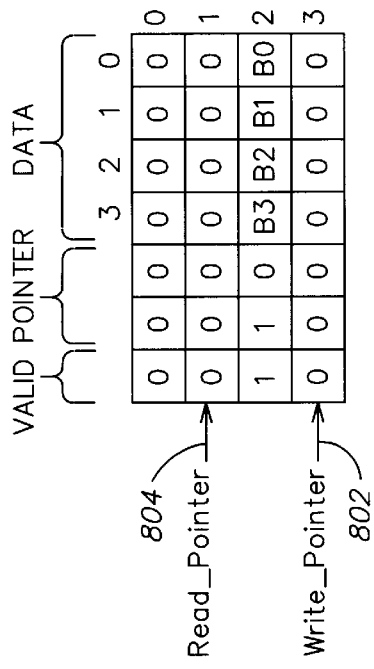
FIG. 12D
FIG. 12E

METHOD AND APPARATUS FOR DETECTING ERRORS IN THE WRITING OF DATA TO A MEMORY

BACKGROUND

Random access memories (RAMs) are used in numerous applications to store digital data. A RAM generally includes multiple individually-addressable memory locations within a memory cell array for storing data. Each memory location typically stores several individual bits (e.g., a byte) of data. A RAM may include a number of ports for writing data to and reading data from its memory cell array. Typically, each port includes data input/output lines, address lines, a write enable line, and an output-enable line.

To read a byte of data from a memory location of the RAM, an address is applied on the address lines of a port, and a pulse is provided on the port's output-enable line. The application of the pulse on the port's output-enable line causes the byte of data stored at the memory location identified by the address to be provided on the data input/output lines of the port.

To write a byte of data to a memory location of a RAM, the byte of data is provided on the data input/output lines of a port, an address (which uniquely identifies the memory location to which data is to be written) is provided on the port's address lines, and a pulse is applied on the port's write-enable line. The application of the pulse on the write-enable line causes the byte of data on the data input/output lines to be written to the memory location identified by the address on the address lines.

Typically, the write-enable line and the data input/output lines are connected to a large number of capacitive components within the memory cell array of the RAM. The pulse applied on the write-enable line therefore must be of a minimum amplitude and duration to provide a sufficient amount of charge onto the line to bring it to a voltage level sufficient to write the data to the memory cell array. Because of this minimum amplitude and pulse-width requirement, the write-enable line of a RAM is said to be level sensitive. Additionally, to ensure that the correct data is written to the memory cell array in response to such a pulse, the data signals must also be applied on the data input/output lines for a minimum period time to charge or discharge the lines properly.

FIG. 1 shows an example of a prior art circuit in which a dual-port RAM 102 (including ports A and B) is employed to implement a first-in first-out buffer (FIFO) 100. As shown in FIG. 1, the port A of the RAM 102 includes data input lines 108a, address lines 106a, and a write-enable line 118a. Similarly, the port B of the RAM 102 includes data output lines 108b, address lines 106b, and an output enable line 118b. In addition to the dual port RAM 102, the FIFO 100 includes a write pointer 104a and a read pointer 104b. As shown in FIG. 1, an output of the write pointer 104a is applied on the address lines 106a of the port A, and an output of the read pointer 104b is applied on the address lines 106b of the port B. The pointers 104a-b are generally implemented using counters.

In the FIG. 1 example, the write enable line 118a and the output enable line 118b are active high. That is, data on the data input lines 108a of the RAM 102 is written to a memory location identified by an address on the address lines 106a in response to a logic-high signal being applied on the write-enable line 118a, and data from a memory location of the RAM 102 identified by an address on the address lines 106b is provided on the data output lines is 108b in response to a logic-high signal being applied on the output-enable line 118b. The pointers 104a–b increment in response to falling edges of signals applied on their clock inputs and are interlocked so as not to violate a FIFO implementation as known in the art.

The FIFO 100 includes data input lines 112, a write line 110, data output lines 116, and a read line 114. When the WRITE signal (applied on the write line 110) transitions from a low state to a high state, the data (Data_in) present at the data input lines 112 is written to the address of the RAM 102 identified by the write pointer 104a. When the WRITE signal subsequently transitions from a high state to a low state, the write pointer 104a increments its output by one. Similarly, when the READ signal (applied on the read line 114) transitions from a low state to a high state, the data at the address identified by the read pointer 104b is presented on the data lines 116 of the FIFO 100. When the READ signal subsequently transitions from a high state to a low state, the read pointer 104b increments its output by one. Therefore, the write pointer 104a effectively points to the next memory location of the RAM 102 that will be written when the WRITE signal next transitions from a low state to a high state, and the read pointer 104b effectively points to the next memory location of the RAM 102 that will be read when the READ signal next transitions from a low state to a high state.

As should be appreciated from the foregoing, each pulse of the WRITE signal both: (1) causes the data on the data lines 112 to be written to the memory location pointed to by the write pointer 104a, and (2) causes the write pointer 104a to increment by one after this data has been written to the RAM 102. Similarly, each pulse of the READ signal both: (1) causes the data at the memory location pointed to by the read pointer 104b to be provided on the data output lines 116, and (2) causes the read pointer 104b to increment by one after this data has been so provided.

FIG. 2 shows an example of how the pointers 104a-b may each point to one of "m" possible memory locations in a memory cell array 200 of the RAM 102 (FIG. 1). Each of the "m" memory locations in the FIG. 2 example includes storage space for "n" data bits. The one of the "m" memory locations currently pointed to by the write pointer 104a is identified in FIG. 2 by an arrow 202, while the one of the memory locations currently pointed to by the read pointer 104b is identified by an arrow 204.

As mentioned above, due to the relatively large capacitance of the write enable line 118a and the data lines 108a of the RAM 102, for the data on the data lines 112 to be correctly written to the memory location currently pointed to by the write pointer 104a, the pulse in the WRITE signal must be of a minimum amplitude and duration, and the data must applied on the data lines 108a for a minimum period of time. The input capacitance of the clock input of the write pointer 104a, however, is much lower than that of the write enable line 118a and the data lines 108a, and the write pointer 104a is edge sensitive (rather than level sensitive). Therefore, a pulse in the WRITE signal may cause the write pointer 104a to increment even though the pulse is not of a sufficient amplitude and/or duration to cause data to be written to the memory location pointed to by the write pointer 104a.

The fact that the write enable line 118a is level sensitive and the write pointer 104a is edge sensitive can cause problems in at least two situations: (1) when an intentionally produced pulse in the WRITE signal is of a sufficient amplitude to cause the write pointer 104a to increment but (e.g., due to noise) is not of a sufficient amplitude and duration to properly write data to the RAM 102, and (2) when noise is introduced on the write line 110 that is of an amplitude sufficient to cause the write pointer 104a to increment when no write to the FIFO 100 was intended.

FIGS. 3–4 and 5–6 illustrate, respectively, the first and second of the two above-mentioned problematic situations as they might occur when writing data to memory locations of the FIFO 100 shown in FIGS. 1–2. In the examples shown in FIGS. 3–6, the memory array 200 of the FIFO 100 includes four memory locations, each being four bits wide.

FIGS. 3 and 5 are timing diagrams each showing the relationship between the data (Data_in), the WRITE signal, and the value of the write pointer 104a over a particular time interval. FIGS. 4A–D illustrate, respectively, the contents of the memory cell array 200 at the times $t_0$–$t_3$ of the timing diagram shown in FIG. 3. FIG. 4E illustrates a situation in which the read pointer 104b points to a memory location that contains stale data (i.e., data left over from a previous pass through the FIFO 100) as a result of the events illustrated in FIGS. 3 and 4A–D. FIGS. 6A–D illustrate, respectively, the contents of the memory cell array 200 at the times $t_0$–$t_3$ of the timing diagram shown in FIG. 5. FIG. 6E illustrates a situation in which the read pointer 104b points to a memory location that contains stale data as a result of the events illustrated in FIGS. 5 and 6A–D.

As shown in FIGS. 3–6, each high pulse in the WRITE signal that is of a sufficient amplitude and duration causes the data (Data_in) to be written to the memory location of the FIFO 100 pointed to by the write pointer 104a at the time the pulse occurs. Also, the falling edges of the pulses in the WRITE signal cause the write pointer 104a to increment by one.

In FIG. 3, between the times $t_1$ and $t_2$, the pulse 302 in the WRITE signal is not of a sufficient amplitude and duration to cause the data (B[0 . . . 3]) to be written to the memory location pointed to by the write pointer 104a (i.e., memory location "1" of the memory cell array 200), but is of a sufficient amplitude that its falling edge causes the write pointer 104a to increment by one. Because the pulse 302 does not cause data to be written to memory location "1," any stale data stored at this memory location during a previous pass through the FIFO 100 is not overwritten. The presence of stale data in the FIFO 100 is illustrated in FIGS. 4C–E by the question marks in memory location "1" of the memory cell array 200.

In FIG. 5, a noise pulse 502 is introduced between adjacent high pulses in the WRITE signal. The noise pulse 502 does not cause any data to be written to the memory location pointed to by the write pointer 104a, but is of a sufficient amplitude that its falling edge causes the write pointer 104a to increment by one (as shown in FIG. 6C). Stale data therefore remains at the memory location skipped by the write pointer 104a (i.e., memory location "1") due to the noise pulse 502. The presence of stale data in the FIFO 100 is illustrated in FIGS. 6C–E by the question marks in memory location "1" of the memory cell array 200.

As noted above, FIGS. 4E and 6E illustrate situations in which the read pointer 104b points to memory locations that contain stale data as a result of the events illustrated, respectively, in FIGS. 3 and 4A–D and FIGS. 5 and 6A–D. In the examples shown, when the system reads data from the memory location "1" of the memory cell array 200, it is expected that this memory location will contain the data (B[0 . . . 3]). Instead, stale data is read from memory location "1." In either situation, with the prior art system shown in FIGS. 1–2, there is no way of determining that the data read from memory location "1" is stale. Therefore, in these examples, the fact that stale data is read from memory location "1" is not recognized by the system. This undetected reading of stale data may result in incorrect data being output by the FIFO 100, thereby causing system errors.

SUMMARY

One aspect of the present invention is directed to a method for operating a buffer memory including a plurality of memory locations, the method including steps of: (a) when data is written to one of the plurality of memory locations, storing at least one bit of validation information in the buffer memory indicating that the data written to the one of the plurality of memory locations is valid; and (b) in response to the data being read from the one of the plurality of memory locations, overwriting the at least one bit of validation information to indicate that the data stored in the one of the plurality of memory locations is invalid.

According to another aspect of the invention, a buffer memory is provided which includes: at least one memory including a plurality of memory locations; first means for, when data is written to one of the plurality of memory locations, storing at least one bit of validation information in the at least one memory indicating that the data written to the one of the plurality of memory locations is valid; and second means for, in response to the data being read from the one of the plurality of memory locations, overwriting the at least one bit of validation information to indicate that the data stored in the one of the plurality of memory locations is invalid.

According to a further aspect of the invention, a buffer memory is provided which includes at least one memory including a plurality of memory locations, and at least one write-control circuit. When data is written to one of the plurality of memory locations, the at least one write-control circuit causes at least one bit of validation information to be written to the at least one memory to indicate that the data written to the one of the plurality of memory locations is valid. In response to data being read from the one of the plurality of memory locations, the at least one write-control circuit causes the at least one bit of validation information to be overwritten to indicate that the data stored in the one of the plurality of memory locations is invalid.

BRIEF DESCRIPTION OF THE DRAWINGS

FIGS. 4A–4E is a diagram illustrating the contents of the memory cell array of FIG. 2 as a result of the sequence of signals illustrated in FIG. 3;

FIGS. 6A–6E is a diagram illustrating the contents of the memory cell array of FIG. 2 as a result of the sequence of signals illustrated in FIG. 5;

FIGS. 12A–12E is a diagram illustrating how the contents of the memory cell array of FIG. 8 change as a result of the signals illustrated in FIG. 11.

DETAILED DESCRIPTION

In one embodiment of the present invention, a method and apparatus is provided in which each time data is written to a memory location of a memory, validation information is also written to the memory. The data and validation information may be written to the memory using the same WRITE signal. Therefore, when a pulse in the WRITE signal is of an insufficient amplitude and/or duration to cause a data to be written to the memory, it also does not cause validation information associated with the data to be written to the memory. Thus, when a memory location is read that is expected to contain valid data, the validation information associated with the data can be checked to determine whether the data was properly written to that memory location, i.e., it can be determined whether the data at a particular memory location is valid or invalid. In this manner, pulses in the WRITE signal of insufficient amplitude and/or duration to cause data to be written to the memory can be detected, rather than going undetected and causing system errors in the manner described above in connection with FIGS. 1–6.

In another embodiment for use with a buffer memory in which each piece of data written to the buffer memory is read from the buffer memory only once (e.g., a FIFO), after data has been read from a memory location of the buffer memory a single time, and prior to reading data from the memory location again, the validation information associated with the data in the memory location is overwritten to indicate that the data in the memory location is stale and is not to be read from the memory location again. Therefore, whenever data is read from any memory location of the buffer memory, a check of the validation information associated with the data determines whether the data in the memory location is stale, and therefore invalid.

As described in more detail below, in one embodiment, each memory location in a buffer memory may store both data and the validation information associated therewith. The validation information stored with the data may include, for example, one or more validation bits, a write pointer that is used to point to the memory location, an error correction code (ECC) calculated for the data stored at the memory location, a combination of the above, or any other information that is capable of serving the same purpose.

In the illustrative examples discussed below, the aspects of the present invention relating to techniques for checking for errors in the writing of data to a memory are employed in connection with a first-in-first-out buffer (FIFO) implemented using a RAM. However, it should be appreciated that the present invention is not limited in this respect, and that the present invention may be employed with numerous other types of buffers and/or memory devices.

Figure 1:
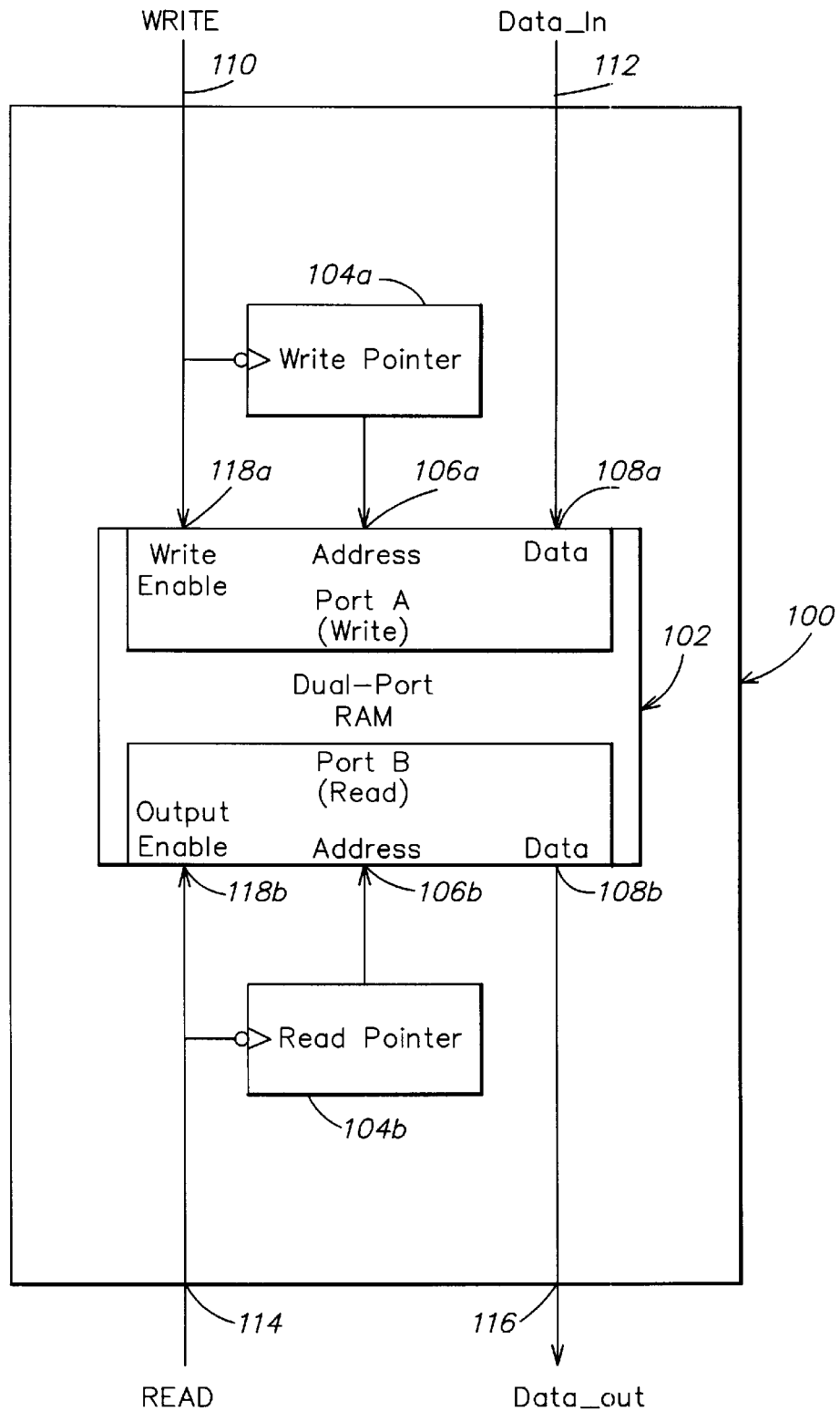
FIG. 1 is a block diagram of a prior art FIFO buffer implemented using a RAM.
Figure 2:
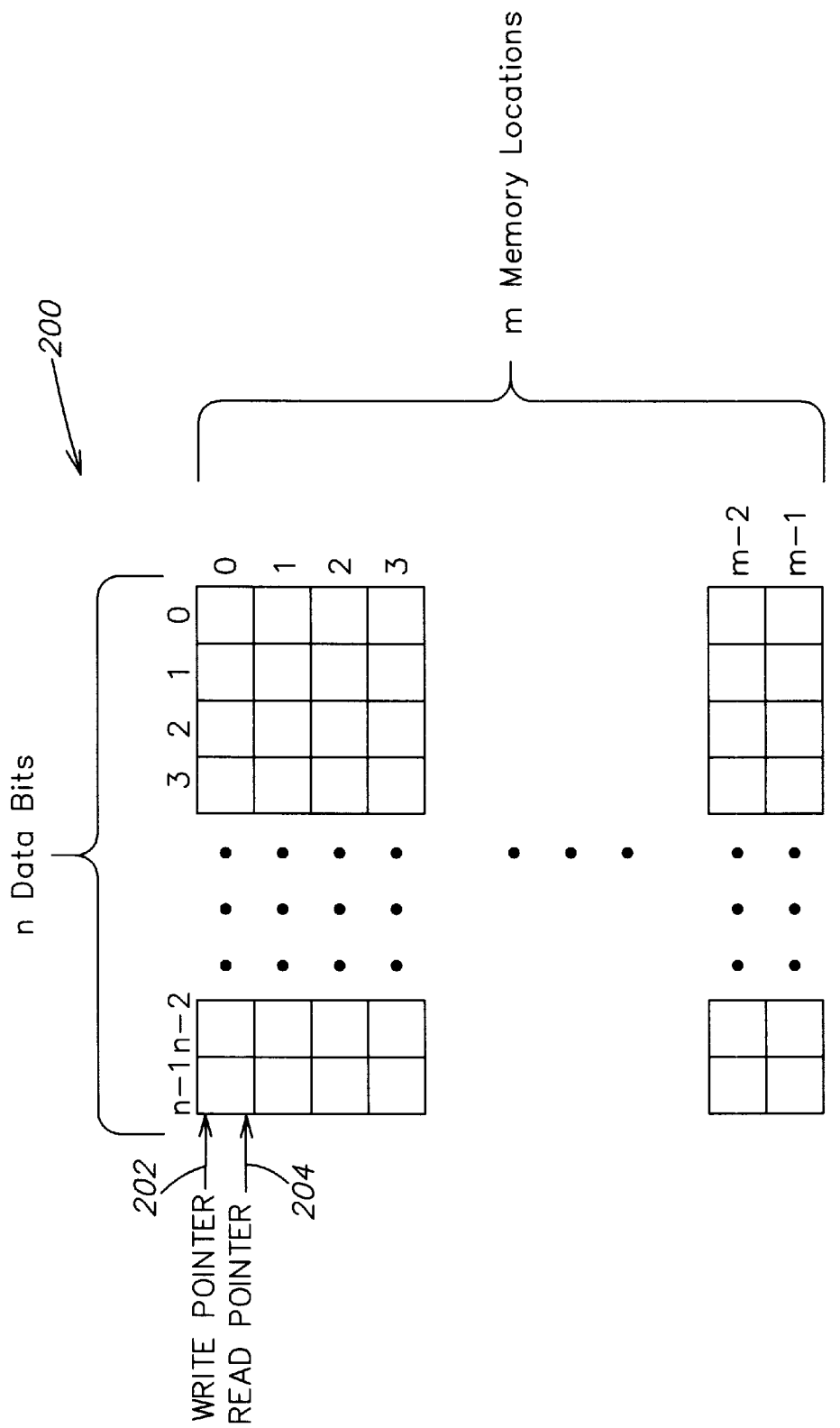
FIG. 2 is a diagram illustrating a memory cell array included in the RAM of FIG. 1.
Figure 3:
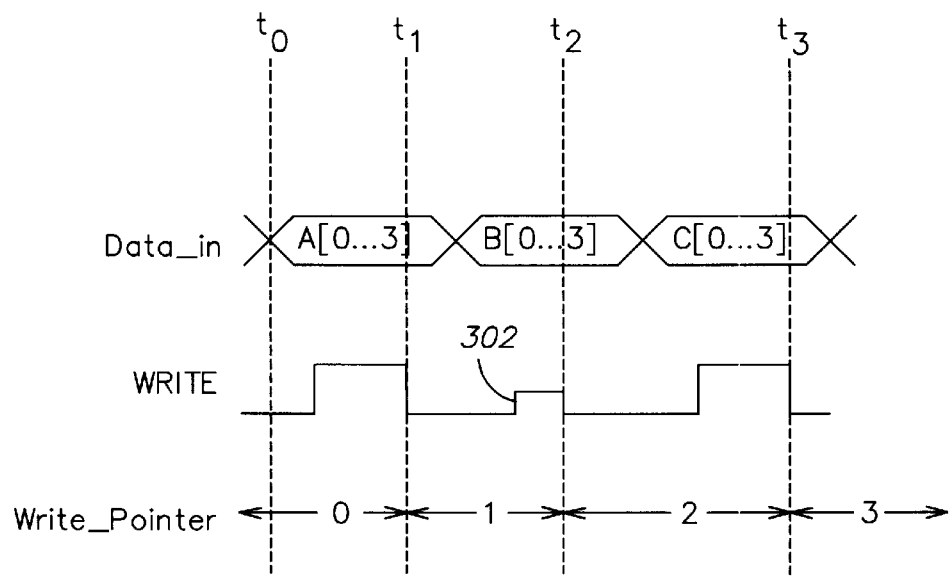
FIG. 3 is a timing diagram showing one sequence of signals that may cause an error in the writing of data to the FIFO of FIG. 1.
Figure 5:
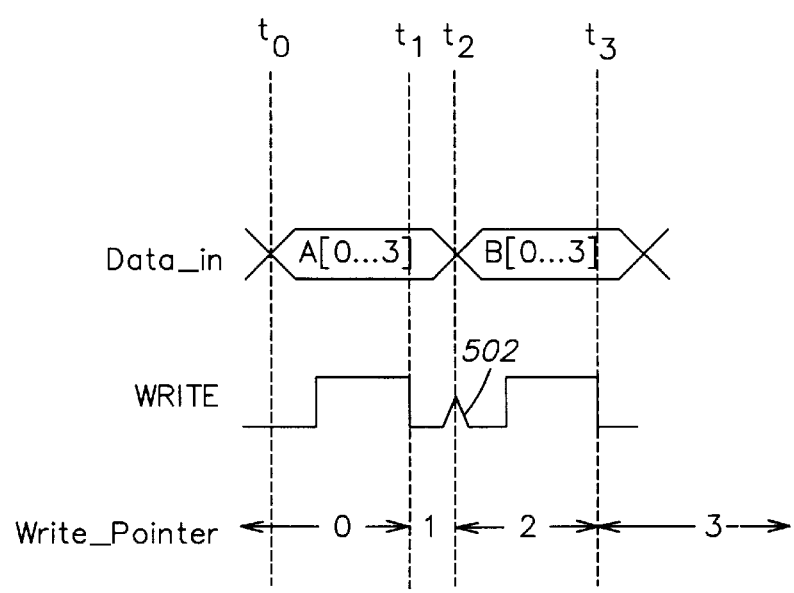
FIG. 5 is a timing diagram showing another sequence of signals that may cause an error in the writing of data to the FIFO of FIG. 1.
Figure 7:
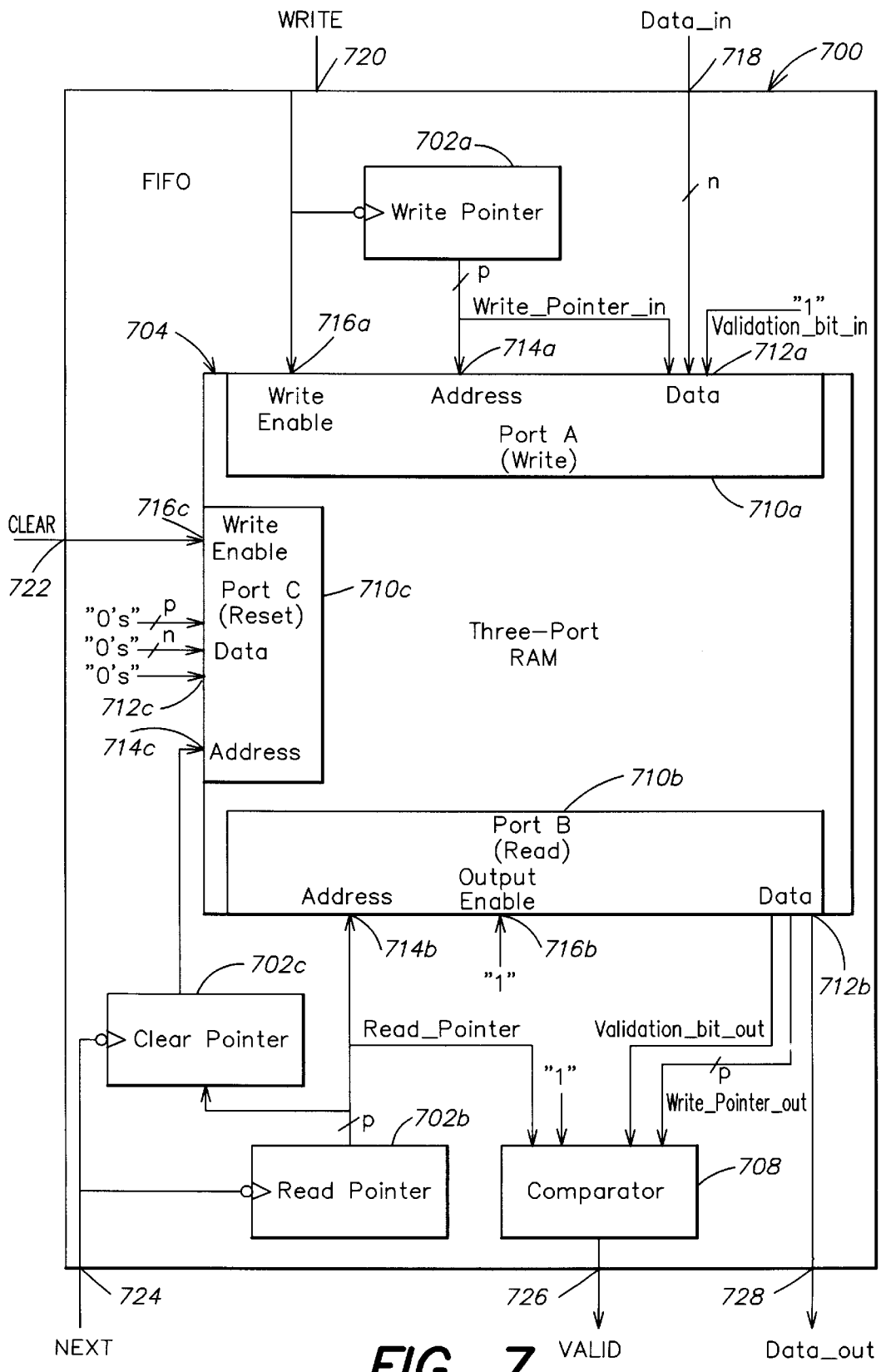
FIG. 7 is an example of a FIFO configured according to one embodiment of the present invention.

An example of a FIFO 700 with which an embodiment of the present invention may be employed is illustrated in FIG. 7. The FIFO 700 includes a three-port RAM 704 (including ports A–C), pointers 702a–c, and a comparator 708. These components may be configured to respond to control signals in any of numerous ways, and the invention is not limited to components that respond in any particular manner. In the embodiment shown, for example, the write-enable lines 716a and 716c are active-high inputs. That is, data provided at the data input lines 712a and 712c is written to the memory locations of the RAM 704 identified by the address lines 714a and 714c, respectively, in response to high pulses on the write-enable lines 716a and 716c. The output-enable line 716b is also active high in the FIG. 7 example. The output-enable line 716b may be maintained in a logic high state so that data at the memory location identified by the address lines 714b is continuously provided on the data output lines 712b. In the FIG. 7 example, the pointers 702a–c each adjusts its output in response to a high to low transition at its clock input.

The FIFO 700 may be used in any of numerous applications, and the invention is not limited to any particular application. In one embodiment, for example, a pair of FIFOs 700 may be included in each of the ports of a multi-port memory so as to enable the ports to buffer asynchronous data transfers between the multi-port memory and circuits that access the multi-port memory via the ports. In such an embodiment, when a circuit, e.g., a CPU, desires to write data to the multi-port memory, the data may be temporarily stored in a FIFO 700 (a write FIFO) included in one of the memory's ports until the port is able to access the memory. Similarly, when data is read from the multi-port memory, the data may be temporarily stored in a FIFO 700 (a read FIFO) until a circuit, e.g., a CPU, is ready to read the data therefrom.

An example of a multi-port memory with which FIFOs 700 may be employed is a cache memory for use in a mass data storage system. Such a cache memory may be capable of storing a very large quantity, e.g., four gigabytes, of data. In one embodiment, the cache memory with which the FIFO 700 is used is included on a circuit board which is interfaced to a backplane, and the FIFO 700 is interposed between the backplane and the cache memory so that the WRITE signal used to write data to the FIFO 700 traverses the backplane where its integrity may be degraded due to noise, etc.

In the FIFO 700, the pointers 702a-b are implemented as "p"-bit counters. The pointer 702a is the write pointer for the FIFO 700, i.e., it points to one of "$2^p$" memory locations of the RAM 704 to which data (Data_in) at data input lines 718 is to be written in response to a high pulse in the WRITE signal on a write line 720. The pointer 702b is the read pointer for the FIFO 700, i.e., it points to the one of the "$2^p$" memory locations of the RAM 704 from which data (Data_out) is read and provided at data output lines 728. Before any data is written to the FIFO 700, each of the pointers 702a-b may be reset to an initial value, "e.g., all "0's," so that they both initially point to the same memory location of the RAM 704.

The pointer 702c in the FIFO 700 is implemented as a register, and is the clear pointer for the FIFO 700. The clear pointer 702c points to a memory location of the RAM 704 to which a predetermined value (at data lines 712c), e.g., all "0's," is to be written in response to a high pulse in a CLEAR signal on a clearing line 722. As shown, the clear pointer 702c and the read pointer 702b may both be clocked by a NEXT signal which is provided at a read line 724 of the FIFO 700, with the clear pointer 702c being loaded with the output of the read pointer 702b. The clear pointer 702c therefore may store a state of the read pointer 702b that is delayed by one transition cycle of the NEXT signal.

In one embodiment, the CLEAR signal is generated by a reliable source, e.g., a source in close proximity to the FIFO 700, so that the CLEAR signal is highly likely to be of a sufficient amplitude and duration to correctly write the predetermined value, e.g., all "0's," to the memory location pointed to by the clear pointer 702c. For this purpose, in one embodiment, the FIFO 700 and the circuitry that generates the CLEAR signal are implemented on the same board, so that the CLEAR signal need not cross a backplane that could introduce noise, and in a further embodiment the circuitry is implemented on the same application specific integrated circuit (ASIC) as the FIFO 700. Examples of how the NEXT and CLEAR signals, respectively, may be applied on the read line 724 and the clearing line 722 in accordance with one embodiment of the invention are described below in connection with FIGS. 9–12.

Figure 8:
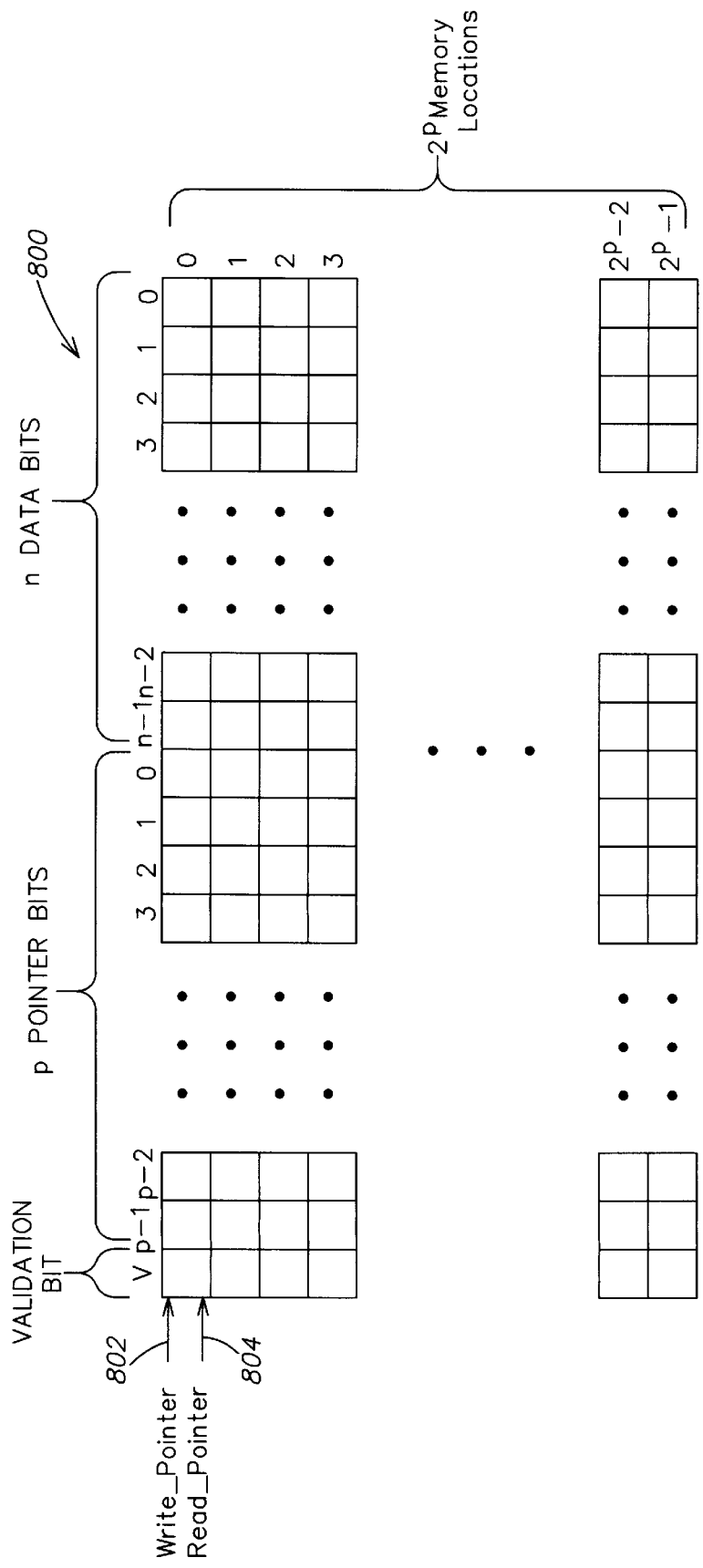
FIG. 8 illustrates one embodiment of a memory cell array organization that may be included in the FIFO of FIG. 7.

The memory cell array of the RAM 704 may be configured in any of numerous ways, and the invention is not limited to any particular configuration. FIG. 8 shows one example of a memory cell array 800 that may be employed in connection with the FIFO 700 of FIG. 7. As shown, the memory cell array 800 includes "$2^p$" memory locations. Each of these "$2^p$" memory locations is "n+p+1" bits wide, with "n" bits storing data, "p" bits storing a value of the write pointer 702a, and one bit storing a validation bit. The memory locations in the memory cell array 800 currently pointed to by the write pointer 702a and the read pointer 702b are identified in FIG. 8 by arrows 802 and 804, respectively.

In the illustrative example of FIG. 7, the "p" bits that store the value of the write pointer 702a and the one validation bit together form a set of validation information that is used in a manner described below to determine whether the "n" bits of data in the memory location are valid. Thus, in the illustrated embodiment, the validation information and its corresponding data are stored in the same memory location. As used herein, a memory location refers to a group of storage locations (e.g., memory cells) in a memory that is uniquely identified by a particular address. The memory may be configured and arranged in any of numerous ways to enable each group of storage locations constituting each memory location to be uniquely addressed, and the invention is not limited to any particular configuration or arrangement of the memory. By storing the data and validation information in the same memory location, the data and validation information may be written to the RAM 704 at the same time using a single address and in response to a single write pulse. Because any write pulse of a sufficient amplitude and duration to write validation information properly to a memory location would also be expected to write data properly to the same memory location, this concurrent writing of the data and validation information to the same memory location using a single write pulse helps to verify that each write pulse used is of the minimum amplitude and duration.

In one embodiment, each memory location of the RAM 704 stores seventy-two bits of data and ECC (i.e., n=72), a six-bit value of the write pointer 702a (i.e., p=6), and a single validation bit. Because conventional RAM chips are not wide enough to support such an arrangement, the RAM 704 may include two separate memory cell arrays, each storing sixty-four 43-bit wide memory words. In such an embodiment, the seventy-two bits of data stored at each memory location of the RAM 704 may be distributed between the two memory cell arrays (thirty-six bits each), and the entire six-bit value of the write pointer 702a and the validation bit (seven bits total) may be stored separately by each of the memory cell arrays. As will be appreciated from the discussion below, duplicating the bits for the write pointer value and the validation bit is advantageous because the contents of each memory cell array may be validated separately in such an arrangement.

As shown in FIGS. 7–8, in addition to "n" bits of data (Data_in) from the data input lines 718, the p-bit value of the write pointer 702a (Write_Pointer_in) and the validation bit (Validation_bit_in) are provided on the data input lines 712a of the RAM 704 for storage at the memory location pointed to by the write pointer 702a in response to a high pulse in the WRITE signal on the write line 720. When data (Data_out) is read from a memory location of the RAM 704 via the data output lines 712b, a stored validation bit (Validation_bit_out) and a stored p-bit value of the write pointer 702a (Write_Pointer_out) are also read from the same memory location.

In the embodiment of FIGS. 7-8, after data (Data_out) is read from one of the "$2^p$" memory locations of the FIFO 700 and the read pointer 702b is incremented (using the NEXT signal) to point to the next memory location, the entire memory location from which the data (Data_out) was just read is overwritten with "0's." In the illustrative embodiment shown, this overwriting is accomplished by: (1) using the clear pointer 702c to store the value of the read pointer 702b before it is incremented using the NEXT signal, (2) addressing the RAM 704 using the value stored in the clear pointer 702c, and (3) producing a high pulse in the CLEAR signal to write the "0's" on the data lines 712c to the memory location pointed to by the clear pointer 702c.

In the embodiment of FIGS. 7-8, the comparator 708 continuously compares: (1) the value of the validation bit (Validation_bit_out) provided on the data output lines 712b with a logic-high signal, and (2) the stored value of the write pointer 702a (Write_Pointer_out) with the current value of the read pointer 702b. Each of these comparisons is useful in detecting errors that could occur when writing data to the memory locations of the RAM 704, as explained below. The comparator 708 provides a VALID signal at its output that is high only when: (1) the validation bit (Validation_bit_out) stored at the memory location pointed to by the read pointer 702b is in a logic-high state, and (2) the current value of the read pointer 702b matches the value of the write pointer 702a (Write_Pointer_out) stored at the memory location pointed to by the read pointer 702b. As is explained in more detail below, the state of the VALID signal at the output of the comparator 708 when data is being read from one of the memory locations in the RAM 704 indicates whether the data being read is valid or invalid.

Because the validation bit accompanying the data at each memory location is overwritten to a logic-low state after the data is read from the memory location and can be written again to the memory location only in response a pulse in the WRITE signal of a minimum amplitude and duration, the value of the validation bit, by itself, is indicative of whether the data associated with the validation bit is valid or invalid. This is true because, after data has been read once from a memory location and the validation bit stored with the data has been overwritten (to a logic-low state) to indicate that the data at the memory location is stale, if a pulse in the WRITE signal is provided that is of a sufficient amplitude and duration to cause new data to be written to the memory location, such a pulse would also cause the validation bit to be written (to a logic-high state). Therefore, in the embodiment of FIGS. 7–8, the validation bit accompanying data being in a logic-high state or a logic-low state indicates, respectively, that the data accompanying the validation bit is valid or invalid.

When the validation bit read from a memory location is in a logic-low state, this condition causes the VALID signal at the output of the comparator 708 to be low regardless of the result of the comparison of the stored value of the write pointer 702a (Write_Pointer_out) with the current value of the read pointer 702b. The VALID signal being in a logic low state when data is read indicates that the data being read is invalid and should not be used. When the validation bit read from a memory location is in a logic-high state, the comparison of the stored validation bit with the logic high state is true, and the state of the VALID signal is dependent only on the comparison of the stored value of the write pointer 702a (Write_Pointer_out) with the current value of the read pointer 702b. As explained below in connection with the examples of FIGS. 9–12, this comparison of the stored value of the write pointer 702a (Write_Pointer_out) with the current value of the read pointer 702b, in addition to checking the state of the validation bit for the accompanying data, can enable the detection of errors in the writing of data to the RAM 704 with greater accuracy than if only a single validation bit was stored and checked.

FIGS. 9–12 illustrate examples of how the embodiment of the invention shown in FIGS. 7–8 can detect errors in the writing of data to a memory such as those described above in connection with FIGS. 3–6. In the examples shown in FIGS. 9–12, the memory cell array 800 includes four memory locations, each memory location including storage space for: (a) four bits of data, (b) a two-bit value of the write pointer 702a, and (c) a single validation bit.

Figure 9:
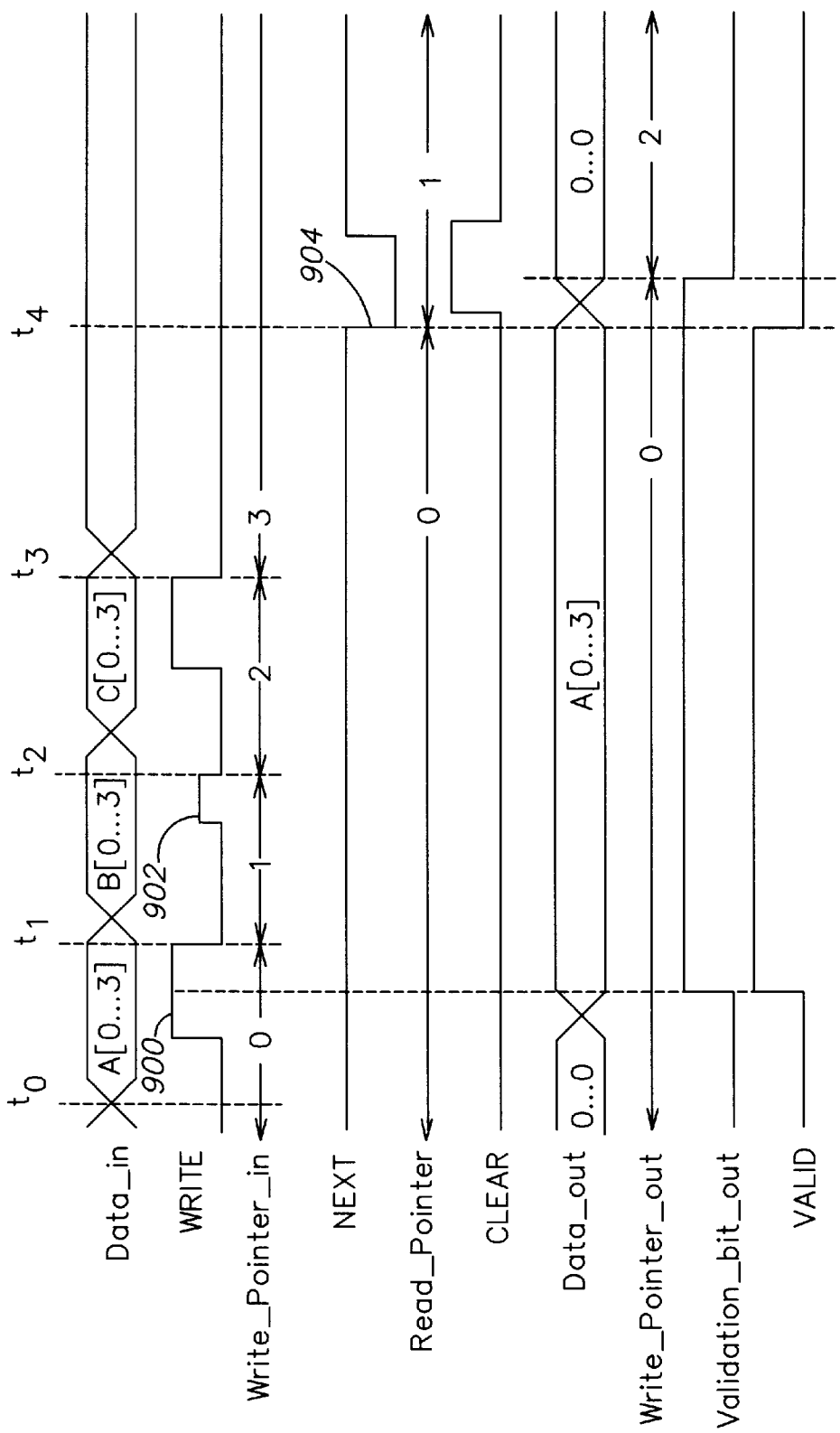
FIG. 9 is a timing diagram showing a sequence of signals that may be applied to the FIFO of FIG. 7.
Figure 10D:
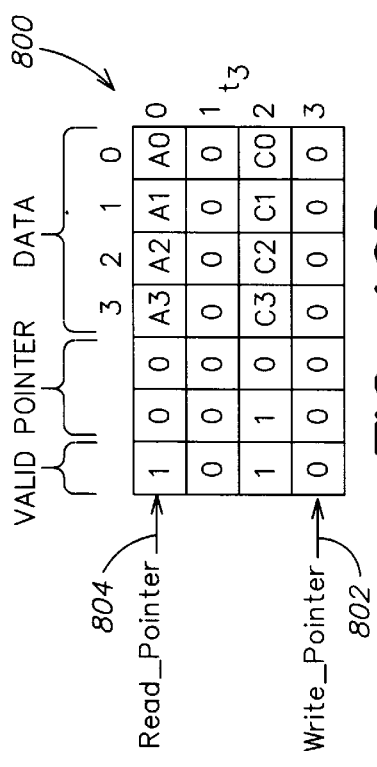
FIGS. 10A–10E is a diagram illustrating how the contents of the memory cell array of FIG. 8 change as a result of the sequence of signals illustrated in FIG. 9.
Figure 10E:
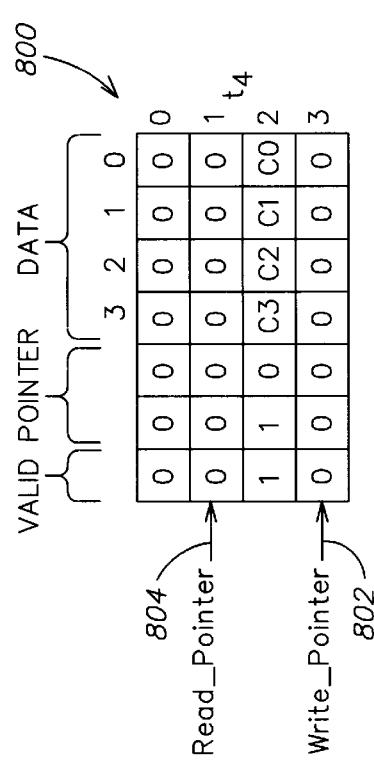
Figure 10A:
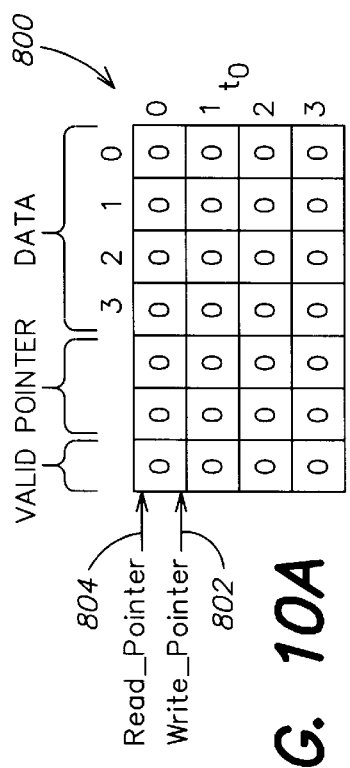
Figure 10B:
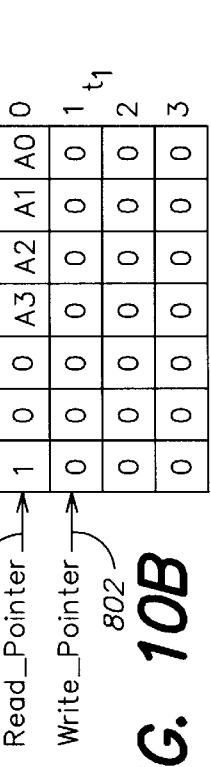
Figure 10C:
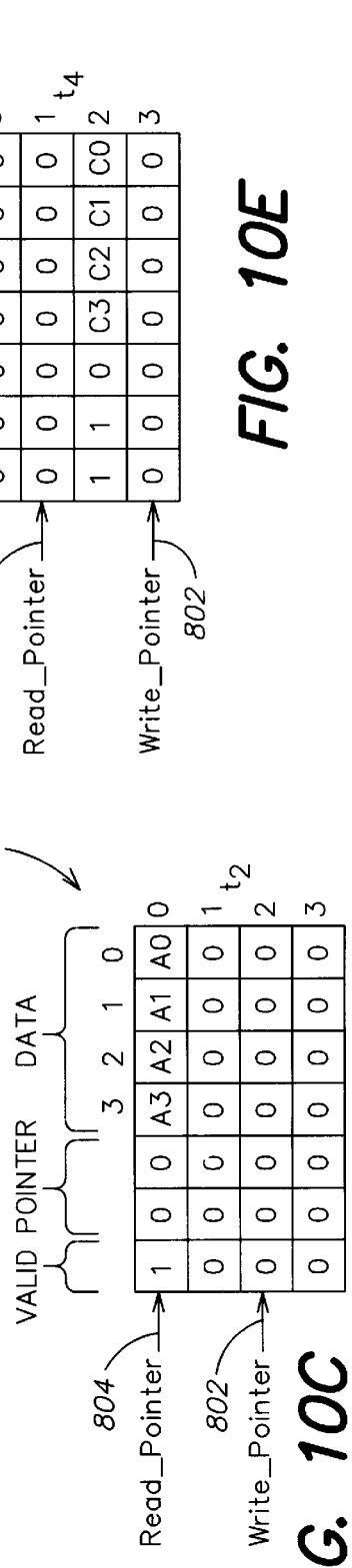
Figure 11:
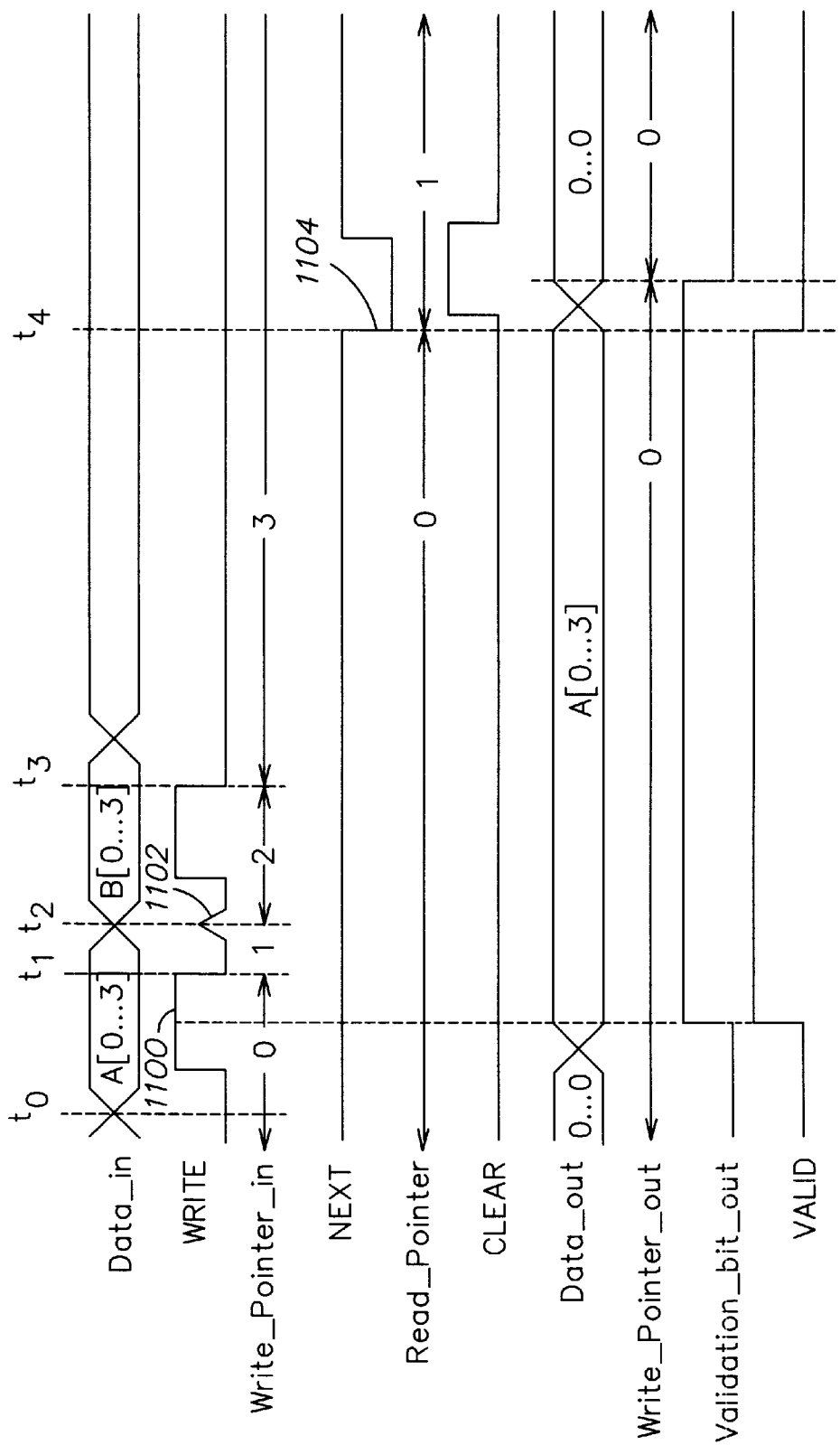
FIG. 11 is a timing diagram showing an alternative sequence of signals that may be applied to the FIFO of FIG. 7.

FIGS. 9 and 11 are timing diagrams, each illustrating signals at various locations within the FIG. 7 circuit during a particular time interval. FIGS. 10A–D illustrate, respectively, the contents of the memory cell array 800 at the times $t_0$–$t_3$ of the timing diagram shown in FIG. 9. FIG. 10E illustrates a situation in which the read pointer 702b points to a memory location that contains invalid data as a result of the events illustrated in FIGS. 9 and 10A–D. FIGS. 12A–D illustrate, respectively, the contents of the memory cell array 800 at the times $t_0$–$t_3$ of the timing diagram shown in FIG. 11. FIG. 12E illustrates a situation in which the read pointer 702b points to a memory location that contains invalid data as a result of the events illustrated in FIGS. 11 and 12A–D.

As shown in FIGS. 9–12, each high pulse in the WRITE signal that is of a sufficient amplitude and duration causes the data (Data_in) to be written to the memory location of the FIFO 700 pointed to by the write pointer 702a at the time the pulse occurs. Also, the falling edge of a pulse in the WRITE signal (of a sufficient amplitude) causes the write pointer 702a to increment by one.

In the example shown in FIGS. 9-10, when the pulse 900 causes the data (Data_in=A[0 . . . 3]) to be written to the memory location pointed to by the write pointer 702a, the current value of the write pointer 702a (Write_Pointer_in= "00") and the validation bit (Validation_bit_in="1") are concurrently written to the memory location along with the data. The falling edge of the pulse 900 causes the value of the write pointer 702a (Write_Pointer_in) to increment by one. The contents of the memory cell array 800 immediately after the falling edge of the pulse 900 has occurred are illustrated in FIG. 10B. After the memory cell array has been written to as illustrated in FIG. 10B, the contents of the memory location pointed to by the read pointer 702b [i.e., the stored data (Data_out=A[0 . . . 3]), the stored validation bit (Validation_bit_out="1"), and the stored value of the write pointer 702a (Write_Pointer_out="00")] are made available at the data output lines 712b.

In FIG. 9, between the times $t_1$ and $t_2$, a pulse 902 in the WRITE signal is not of a sufficient amplitude and duration to cause the Data (B[0 . . . 3]), the current value of the write pointer 702a (Write_Pointer_in), or the validation bit (Validation_bit_in) to be written to the memory location pointed to by the write pointer 702a, but is of a sufficient amplitude that its falling edge causes the write pointer 702a to increment by one. Because the pulse 902 does not cause any information to be written to the memory location pointed to by the write pointer 902, whatever information was present at that memory location before the attempted write was performed remains in the FIFO 700. In contrast to the prior art FIFO 100 described above, however, in the particular embodiment shown in FIGS. 9–10, this left over information is not stale data. Rather, since each memory location is overwritten with "0's" after data is read from it a single time, the information left over in memory location "1" of the FIFO 700 is all "0's." However, in alternate embodiments of the present invention, the data need not be overwritten after a memory location is read, so that stale data could remain in the memory as a result of the insufficient write pulse 902. All that is necessary is that at least one bit of validation information (e.g., the stored value of the write pointer 702a or the stored validation bit) be overwritten as described below.

As shown in FIG. 9, the VALID signal is in a logic-high state only when: (1) the current value of the read pointer 702b matches the value of the write pointer 702a (Write_Pointer_out) stored at the memory location pointed to by the read pointer 702b, and (2) the validation bit (Validation_bit_out) stored at the memory location pointed to by the read pointer 702b is in a logic-high state. When a high-to-low transition 904 in the NEXT signal causes the read pointer 702b to increment (at time $t_4$) to read the next memory location of the FIFO 700, the current value of the read pointer 702b ("01") no longer matches the stored value of the write pointer 702a (Write_Pointer_out="00"). This mismatch causes the VALID signal to transition immediately to a logic-low state. Also, when the contents of the memory location pointed to by the current value of the read pointer 702b are provided on the data output lines 712b, not only does the current value of the read pointer 702b ("01") not match the stored value of the write pointer 702a (Write_Pointer_out="00"), but the stored validation bit (Validation_bit_out) is also no longer in a logic-high state.

Because the VALID signal is in a logic-low state after the time $t_4$, the data included in the memory location pointed to by the read pointer 702b after the time $t_4$ is determined to be invalid. Thus, by writing validation information along with the data stored at each memory location in the RAM 704, and overwriting the validation information in response to data being read from each memory location, the example embodiment of FIGS. 7-8 is able to detect the anomalous situation illustrated FIGS. 9-10 wherein, due to an attempted pulse 902 in the WRITE signal that is of an insufficient amplitude and/or duration to write data properly to the RAM 704, the write pointer 702a skips a memory location of the RAM 704 without writing any data thereto.

In one embodiment, when the VALID signal from the comparator 708 is in a logic-low state when data is read from any memory location of the RAM 704 during a data transfer operation, the initiator of the operation is instructed to attempt the data transfer again. It should be appreciated, however, that other error recovery techniques may alternatively be employed in response to a detected error in the writing of data to the RAM 704, and that the present invention is not limited to any particular type of error recovery. The remedial measure taken (if any) will depend on the application in which the FIFO 700 is used.

It should be appreciated that the comparison of the stored value of the write pointer 702a with the current value of the read pointer 702b provides greater protection for detecting errors in the writing of data to the RAM 704 than if only a single validation bit was stored and checked in the manner described above. For example, if the amplitude and duration of a pulse in the WRITE signal was only marginally sufficient to cause the validation bit to be written properly to a memory location, it is possible that other portions of the information written to the memory location in response to the same pulse might not be written properly. Comparing the value of the write pointer 702a stored at a memory location ensures that a greater number of bits were properly written to the memory location, increasing the likelihood that all bits were properly written thereto.

Although comparing the stored value of the write pointer 702a (Write_Pointer_out) with the current value of the read pointer 702b can be advantageous for the reasons discussed above, it should be understood that the present invention is not limited in this respect. It is important only that, for each memory location at which data is stored, a corresponding information field be stored in memory that can be overwritten in response to data being read from that memory location. In one alternative embodiment, for example, the validation bit alone can constitute such an information field.

In addition to data to be stored by the FIFO 700, the "n" bits of data (Data_in) provided on the data lines 718 may include an ECC calculated for the data. As will be appreciated by those skilled in the art, ECC bits are commonly stored along with data in a memory to allow data integrity errors to be detected and/or corrected. In one embodiment of the invention, an ECC calculation scheme may be employed that includes at least one combination of ECC and data bits that is known to be invalid, e.g., when all "n" bits are "0." In response to data being read from any memory location in the RAM 704, the "n" bits at that memory location may be overwritten with the invalid value (e.g., all "0's"). Since the data and ECC bits are overwritten in this manner, invalid data (e.g., stale data or data that was attempted to be written using a write pulse of an insufficient amplitude and/or duration) may be detected by examining the "n" bits of data and ECC (Data_out). When the stored data and ECC bits (Data_out) are other than the invalid value (e.g., not all "0's"), it is determined that the data is valid. When the stored data and ECC bits (Data_out) are the invalid value (e.g., all "0's"), it is determined that the data is invalid.

Thus, it should be appreciated that, in some embodiments, dedicated bits for validation information need not be included in a memory location to indicate the validity of the data stored at that location. Rather, information already stored in the memory (e.g., the ECC bits) can be used to provide the validation information.

Turning now to the example shown in FIGS. 11 and 12, when the pulse 1100 causes the data (Data_in=A[0 . . . 3]) to be written to the memory location pointed to by the write pointer 702a, the current value of the write pointer 702a (Write_Pointer_in="00") and the validation bit (Validation_bit_in="1") are concurrently written to the memory location along with the data. The falling edge of the pulse 1100 causes the value of the write pointer 702a (Write_Pointer_in) to increment by one. The contents of the memory cell array 800 immediately after the falling edge of the pulse 1100 has occurred are illustrated in FIG. 12B. After the memory cell array has been written to as illustrated in FIG. 12B, the contents of the memory location pointed to by the read pointer 702b [i.e., the stored data (Data_out= A[0 . . . 3]), the stored validation bit (Validation_bit_out= 1), and the stored value of the write pointer 702a (Write_ Pointer_out="00")] are made available at the data output lines 712b.

In FIG. 11, a noise pulse 1102 in the WRITE signal is of a sufficient amplitude that its falling edge causes the write pointer 702a to increment by one. Because the pulse 1102 does not cause any information to be written to the memory location pointed to by the write pointer 702a, whatever information was present at that memory location before the attempted write was performed remains in the FIFO 700. Thus, the data in that memory location is not valid. Rather, since each memory location is overwritten with "0's" after data is read from it a single time, the information left over in memory location "1" of the FIFO 700 is all "0's."

As shown in FIG. 11, the VALID signal is in a logic-high state only when: (1) the current value of the read pointer 702b matches the value of the write pointer 702a (Write_ Pointer_out) stored at the memory location pointed to by the read pointer 702b, and (2) the validation bit (Validation_ bit_out) stored at the memory location pointed to by the read pointer 702b is in a logic-high state. When a high-to-low transition 1104 in the NEXT signal causes the read pointer 702b to increment (at time $t_4$) to read the next location of the FIFO, the current value of the read pointer 702b no longer matches the stored value of the write pointer 702a (Write_Pointer_out="00"). This mismatch causes the VALID signal to transition immediately to a logic-low state. Also, when the contents of the memory location pointed to by the current value of the read pointer 702b ("01") are provided on the data output lines 712b, not only does the current value of the read pointer 702b ("01") not match the stored value of the write pointer 702a (Write_Pointer_out= "00"), but the stored validation bit (Validation_bit_out) is also no longer in a logic-high state.

Because the VALID signal is in a logic-low state after the time $t_4$, the data included in the memory location pointed to by the read pointer 702b after the time $t_4$ is determined to be invalid. Thus, by writing validation information along with the data stored at each memory location in the RAM 704, and overwriting the validation information in response to data being read from each memory location, the illustrative embodiment of FIGS. 7I4 8 is able to detect the anomalous situation illustrated FIGS. 11–12 wherein, because of a noise pulse in the WRITE signal, the write pointer 702a skips a memory location of the memory cell array 800 without writing any data thereto.

As discussed above, each memory location of the RAM 704 may be rewritten, or another appropriate error recovery measure may be taken, when data at any memory location in the FIFO 700 is determined to be invalid.

It should be appreciated that, while the illustrative embodiment described above in connection with FIGS. 7–12 is implemented as a FIFO, alternative embodiments of the invention may be directed to any other data storage device in which, for each piece of data that is written to a memory location, the written data is read only once from that memory location. One example of such an alterative data storage device is a last-in first-out buffer (LIFO).

Having described at least one embodiment in detail, various modifications and improvements will readily occur to those skilled in the art. Such modifications and improvements are intended to be within the spirit and scope of the invention. Accordingly, the foregoing description is by way of example only, and is not intended to be limiting.

What is claimed is:

1. A method for operating a buffer memory including a plurality of memory locations, the method comprising steps of:

(a) when data is written to one of the plurality of memory locations, storing at least one bit of validation information in the buffer memory indicating that the one of the plurality of memory locations contains valid data; and (b) in response to the data being read from the one of the plurality of memory locations, overwriting the at least one bit of validation information to indicate that the one of the plurality of memory locations does not contain valid data.

2. The method of claim 1, wherein the step (a) includes a step of:

(a1) using a common write signal to write both the data and the at least one bit of validation information to the buffer memory.

3. The method of claim 2, wherein the buffer memory includes at least one random access memory (RAM) including the plurality of memory locations and a write pointer to specify an address of the one of the plurality of memory locations to which the data is to be written in response to an active state of the common write signal applied to a write line of the at least one RAM, and wherein the method further includes a step of:

in response to the active state of the common write signal, adjusting a value of the write pointer.

4. The method of claim 2, wherein the step (a1) includes a step of:

using the common write signal to write both the data and the at least one bit of validation information to the one of the plurality of memory locations.

5. The method of claim 1, wherein the buffer memory includes at least one random access memory (RAM) including the plurality of memory locations and a write pointer to specify an address of the one of the plurality of memory locations to which the data is to be written in response to an active state of a write signal applied to a write line of the at least one RAM, and wherein the method further includes a step of:

in response to the active state of the write signal, adjusting a value of the write pointer.

6. The method of claim 1, wherein the step (b) includes a step of:

overwriting both the data and the at least one bit of validation information in response to the data being read from the one of the plurality of memory locations.

7. The method of claim 1, further including a step of:

(c) in association with the one of the plurality of memory locations being read, checking the at least one bit of validation information to determine whether the one of the plurality of memory locations being read contains valid data.

8. The method of claim 7, wherein the step (c) includes a step of checking the at least one bit of validation information to determine, without reference to the data contained in the one of the plurality of memory locations, whether the one of the plurality of memory locations being read contains valid data.

9. The method of claim 1, wherein the buffer memory includes a write pointer to specify an address of the one of the plurality of memory locations to which data is to be written, and wherein:

the step (a) includes a step of (a1) storing a value of the write pointer as the at least one bit of validation information indicating that the one of the plurality of memory locations contains valid data; and the step (b) includes a step of overwriting the value of the write pointer stored as the at least one bit of validation information to a different value.

10. The method of claim 9, wherein the step (a1) includes a step of:

using a common write signal to write both the data and the value of the write pointer to the buffer memory.

11. The method of claim 1, wherein:

the step (a) includes a step of storing an error correction code (ECC), corresponding to the data written to the one of the plurality of memory locations, in the buffer memory as the at least one bit of validation information indicating that the one of the plurality of memory locations contains valid data; and the step (b) includes a step of overwriting the ECC stored in the buffer memory as the at least one bit of validation information to a value that is not a valid ECC.

12. The method of claim 1, wherein the buffer memory includes at least one random access memory (RAM) including the plurality of memory locations, a write pointer to specify an address of the one of the plurality of memory locations to which data is to be written in response to an active state of a write signal applied to a write line of the at least one RAM, and a read pointer to specify an address of one of the plurality of memory locations from which data is to be read in response to an active state of a read signal applied to an output enable line of the at least one RAM, and wherein the method further includes steps of:

adjusting a value of the write pointer each time data is written to the one of the plurality of memory locations specified by the write pointer; and adjusting a value of the read pointer each time data is read from the one of the plurality of memory locations specified by the read pointer.

13. The method of claim 1, further including a step of operating the buffer memory as a first-in first-out (FIFO) buffer.

14. The method of claim 1, further including a step of operating the buffer memory as a last-in first-out (LIFO) buffer.

15. The method of claim 1, wherein the buffer memory includes at least one random access memory (RAM) including the plurality of memory locations and at least first and second ports, and wherein:

the step (a) includes a step of (a1) writing the at least one bit of validation information to the buffer memory via the first port of the at least one RAM; and the step (b) includes a step of (b1) overwriting the at least one bit of validation information via the second port of the at least one RAM.

16. The method of claim 15, wherein:

the step (a1) includes a step of writing both the data and the at least one bit of validation information to the buffer memory via the first port of the at least one RAM.

17. The method of claim 16, wherein:

the step (b1) includes a step of overwriting both the data and the at least one bit of validation information via the second port of the at least one RAM.

18. The method of claim 1, further including a step of:

for each one of the plurality of memory locations, performing the step (a) to store a corresponding at least one bit of validation information in the at least one memory each time data is written to the one of the plurality of memory locations.

19. The method of claim 18, further including a step of:

for each one of the plurality of memory locations, performing the step (b) to overwrite the corresponding at least one bit of validation information each time data is read from the one of the plurality of memory locations.

20. The method of claim 1, wherein the step (a) includes a step of generating the at least one bit of validation information independent of the data written to the one of the plurality of memory locations.

21. The method of claim 1, further including a step of:
(c) after the one of the plurality of memory locations has been read, checking the at least one bit of validation information to determine whether the one of the plurality of memory locations contained valid data when the one of the plurality of memory location was read.

22. The method of claim 21, wherein the step (c) includes a step of checking the at least one bit of validation information to determine, without reference to the data read from the one of the plurality of memory locations, whether the one of the plurality of memory locations contained valid data when the one of the plurality of memory location was read.

23. A buffer memory, comprising:
at least one memory including a plurality of memory locations;
first means for, when data is written to one of the plurality of memory locations, storing at least one bit of validation information in the at least one memory indicating that the one of the plurality of memory locations contains valid data; and
second means for, in response to the data being read from the one of the plurality of memory locations, overwriting the at least one bit of validation information to indicate that the one of the plurality of memory locations does not contain valid data.

24. The buffer memory of claim 23, wherein the first means includes means for using a common write signal to write both the data and the at least one bit of validation information to the at least one memory.

25. The buffer memory of claim 24, wherein the at least one memory includes at least one random access memory (RAM) including the plurality of memory locations, and wherein the buffer memory further includes:
a write pointer to specify an address of the one of the plurality of memory locations to which the data is to be written in response to an active state of the common write signal applied to a write line of the at least one RAM, and
means for adjusting a value of the write pointer in response to the active state of the common write signal.

26. The buffer memory of claim 24, wherein the means for using the common write signal to write both the data and the at least one bit of validation information to the at least one memory includes means for using the common write signal to write both the data and the at least one bit of validation information to a same one of the plurality of memory locations.

27. The buffer memory of claim 23, wherein the at least one memory includes at least one random access memory (RAM) including the plurality of memory locations, and wherein the buffer memory further includes:
a write pointer to specify an address of the one of the plurality of memory locations to which the data is to be written in response to an active state of a write signal applied to a write line of the at least one RAM, and
means for adjusting a value of the write pointer in response to the active state of the write signal.

28. The buffer memory of claim 23, wherein the second means includes means for overwriting both the data and the at least one bit of validation information in response to the data being read from the one of the plurality of memory locations.

29. The buffer memory of claim 23, further including means for, in association with the one of the plurality of memory locations being read, checking the at least one bit of validation information to determine whether the one of the plurality of memory locations being read contains valid data.

30. The buffer memory of claim 24, wherein the means for checking the at least one bit of validation information includes means for checking the at least one bit of validation information to determine, without reference to the data contained in the one of the plurality of memory locations, whether the one of the plurality of memory locations being read contains valid data.

31. The buffer memory of claim 23, wherein:
the buffer memory includes a write pointer to specify an address of the one of the plurality of memory locations to which data is to be written;
the first means includes means for storing a value of the write pointer as the at least one bit of validation information indicating that the one of the plurality of memory locations contains valid data; and
the second means includes means for overwriting the value of the write pointer stored as the at least one bit of validation information to a different value.

32. The buffer memory of claim 31, wherein the means for storing the value of the write pointer as the at least one bit of validation information includes means for using a common write signal to write both the data and the value of the write pointer to the at least one memory.

33. The buffer memory of claim 23, wherein:
the first means includes means for storing an error correction code (ECC), corresponding to the data written to the one of the plurality of memory locations, in the at least one memory as the at least one bit of validation information indicating that the one of the plurality of memory locations contains valid data; and
the second means includes means for overwriting the ECC stored in the at least one memory to a value that is not a valid ECC.

34. The buffer memory of claim 23, wherein the at least one memory includes at least one random access memory (RAM) including the plurality of memory locations, and wherein the buffer memory further includes:
a write pointer to specify an address of the one of the plurality of memory locations to which data is to be written in response to an active state of a write signal applied to a write line of the at least one RAM;
a read pointer to specify an address of one of the plurality of memory locations from which data is to be read in response to an active state of a read signal applied to an output enable line of the at least one RAM;
means for adjusting a value of the write pointer each time data is written to the one of the plurality of memory locations specified by the write pointer; and
means for adjusting a value of the read pointer each time data is read from the one of the plurality of memory locations specified by the read pointer.

35. The buffer memory of claim 23, wherein:
the at least one memory includes at least one random access memory (RAM) including the plurality of memory locations and at least first and second ports;
the first means includes means for writing the at least one bit of validation information to the at least one memory via the first port of the at least one RAM; and the second means includes means for overwriting the at least one bit of validation information via the second port of the at least one RAM.

36. The buffer memory of claim 35, further including means for writing the data to the at least one memory via the first port of the at least one RAM.

37. The buffer memory of claim 36, wherein the means for overwriting the at least one bit of validation information via the second port of the at least one RAM includes means for overwriting both the data and the at least one bit of validation information via the second port of the at least one RAM.

38. The buffer memory of claim 23, wherein the buffer memory is a first-in first-out (FIFO) buffer.

39. The buffer memory of claim 23, wherein the buffer memory is a last-in first-out (LIFO) buffer.

40. The buffer memory of claim 23, further including means for, each time data is written to any one of the plurality of memory locations, storing a corresponding at least one bit of validation information in the at least one memory indicating that the one of the plurality of memory locations contains valid data.

41. The buffer memory of claim 40, further including means for, each time data is read from any one of the plurality of memory locations, overwriting the corresponding at least one bit of validation information for the one of the plurality of memory locations to indicate that the one of the plurality of memory locations does not contain valid data.

42. The buffer memory of claim 23, wherein the first means includes means for generating the at least one bit of validation information independent of the data written to the one of the plurality of memory locations.

43. The buffer memory of claim 23, further including means for, after the one of the plurality of memory locations has been read, checking the at least one bit of validation information to determine whether the one of the plurality of memory locations contained valid data when the one of the plurality of memory location was read.

44. The buffer memory of claim 43, wherein the means for checking the at least one bit of validation information includes means for checking the at least one bit of validation information to determine, without reference to the data read from the one of the plurality of memory locations, whether the one of the plurality of memory locations contained valid data when the one of the plurality of memory location was read.

45. A buffer memory comprising:
   at least one memory including a plurality of memory locations; and
   at least one write-control circuit that, when data is written to one of the plurality of memory locations, causes at least one bit of validation information to be written to the at least one memory to indicate that the one of the plurality of memory locations contains valid data, and that, in response to data being read from the one of the plurality of memory locations, causes the at least one bit of validation information to be overwritten to indicate that the one of the plurality of memory locations does not contain valid data.

46. The buffer memory of claim 45, wherein the at least one write-control circuit is configured such that a common write signal causes both the data and the at least one bit of validation information to be written to the at least one memory.

47. The buffer memory of claim 46, wherein the at least one memory includes at least one random access memory (RAM) including the plurality of memory locations, and wherein the buffer memory further includes:
   a write pointer to specify an address of the one of the plurality of memory locations to which the data is to be written in response to an active state of the common write signal applied to a write line of the at least one RAM, the write pointer being arranged such that its value is adjusted in response to the active state of the common write signal.

48. The buffer memory of claim 46, wherein the at least one write-control circuit is configured such that the common write signal causes both the data and the at least one bit of validation information to be written to the one of the plurality of memory locations.

49. The buffer memory of claim 45, wherein the at least one memory includes at least one random access memory (RAM) including the plurality of memory locations, and wherein the buffer memory further includes:
   a write pointer to specify an address of the one of the plurality of memory locations to which the data is to be written in response to an active state of a write signal applied to a write line of the at least one RAM, the write pointer being arranged such that its value is adjusted in response to the active state of the write signal.

50. The buffer memory of claim 45, wherein the at least one write-control circuit is configured to overwrite both the data and the at least one bit of validation information in response to the data being read from the one of the plurality of memory locations.

51. The buffer memory of claim 45, further including a comparator that, in association with the one of the plurality of memory locations being read, checks the at least one bit of validation information to determine whether the one of the plurality of memory locations being read contains valid data.

52. The buffer memory of claim 51, wherein the comparator is coupled to the at least one memory to receive the at least one bit of validation information at an input thereof, and wherein the comparator is configured to determine, without reference to the data contained in the one of the plurality of memory locations, whether the one of the plurality of memory locations being read contains valid data.

53. The buffer memory of claim 45, wherein:
   the buffer memory includes a write pointer to specify an address of the one of the plurality of memory locations to which data is to be written; and
   the at least one write-control circuit is configured to write a value of the write pointer as the at least one bit of validation information indicating that the one of the plurality of memory locations contains valid data, and in response to the data being read from the one of the plurality of memory locations, to overwrite the value of the write pointer stored as the at least one bit of validation information to a different value.

54. The buffer memory of claim 53, wherein the at least one write-control circuit is configured such that a common write signal causes both the data and the value of the write pointer to be written to the at least one memory.

55. The buffer memory of claim 45, wherein:
   the at least one write-control circuit is configured to store an error correction code (ECC), corresponding to the data written to the one of the plurality of memory locations, in the at least one memory as the at least one bit of validation information indicating that the one of the plurality of memory locations contains valid data, and in response to the data being read from the one of the plurality of memory locations, to overwrite the ECC stored in the at least one memory to a value that is not a valid ECC.

56. The buffer memory of claim 45, wherein the at least one memory includes at least one random access memory (RAM) including the plurality of memory locations, and wherein the buffer memory further includes:

a write pointer to specify an address of the one of the plurality of memory locations to which data is to be written in response to an active state of a write signal applied to a write line of the at least one RAM, the write pointer being arranged such that its value is adjusted in response to the active state of the write signal; and a read pointer to specify an address of one of the plurality of memory locations from which data is to be read in response to an active state of a read signal applied to an output enable line of the at least one RAM, the read pointer being arranged such that its value is adjusted each time data is read from the one of the plurality of memory locations specified by the read pointer.

57. The buffer memory of claim 45, wherein:

the at least one memory includes at least one random access memory (RAM) including the plurality of memory locations and at least first and second ports; and the at least one write-control circuit is configured to write the at least one bit of validation information to the at least one memory via the first port of the at least one RAM, and to overwrite the at least one bit of validation information via the second port of the at least one RAM.

58. The buffer memory of claim 57, wherein the at least one write-control circuit is configured to write both the data and the at least one bit of validation information to the at least one memory via the first port of the at least one RAM.

59. The buffer memory of claim 58, wherein the at least one write-control circuit is configured to overwrite both the data and the at least one bit of validation information via the second port of the at least one RAM.

60. The buffer memory of claim 45, wherein the buffer memory is a first-in first-out (FIFO) buffer.

61. The buffer memory of claim 45, wherein the buffer memory is a last-in first-out (LIFO) buffer.

62. The buffer memory of claim 45, wherein the at least one write-control circuit is configured such that, each time data is written to any one of the plurality of memory locations, the at least one write-control circuit causes a corresponding at least one bit of validation information to be written to the at least one memory to indicate that the one of the plurality of memory locations contains valid data.

63. The buffer memory of claim 62, wherein the at least one write-control circuit is configured such that, each time data is read from any one of the plurality of memory locations, the at least one write-control circuit causes the corresponding at least one bit of validation information for the one of the plurality of memory locations to be overwritten to indicate that the one of the plurality of memory locations does not contain valid data.

64. The buffer memory of claim 45, wherein the at least one write-control circuit is configured to generate the at least one bit of validation information independent of the data written to the one of the plurality of memory locations.

65. The buffer memory of claim 45, further including a comparator that, after the one of the plurality of memory locations has been read, checks the at least one bit of validation information to determine whether the one of the plurality of memory locations contained valid data when the one of the plurality of memory location was read.

66. The buffer memory of claim 65, wherein the comparator is coupled to the at least one memory to receive the at least one bit of validation information at an input thereof, and wherein the comparator is configured to determine, without reference to the data read from the one of the plurality of memory locations, whether the one of the plurality of memory locations contained valid data when the one of the plurality of memory location was read.

* * * * *